(12) United States Patent
Nasiri et al.

(10) Patent No.: US 9,751,752 B2
(45) Date of Patent: Sep. 5, 2017

(54) METHOD OF FABRICATION OF AL/GE BONDING IN A WAFER PACKAGING ENVIRONMENT AND A PRODUCT PRODUCED THEREFROM

(71) Applicant: INVENSENSE, INC., San Jose, CA (US)

(72) Inventors: Steven S. Nasiri, Saratoga, CA (US); Anthony F. Flannery, Jr., Los Gatos, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 15/364,478

(22) Filed: Nov. 30, 2016

(65) Prior Publication Data

US 2017/0073223 A1    Mar. 16, 2017

Related U.S. Application Data

(63) Continuation of application No. 14/853,873, filed on Sep. 14, 2015, now Pat. No. 9,533,880, which is a (Continued)

(51) Int. Cl.
*H01L 29/04* (2006.01)
*H01L 31/036* (2006.01)
(Continued)

(52) U.S. Cl.
CPC ........ *B81C 1/00238* (2013.01); *B23K 20/023* (2013.01); *B81B 3/0018* (2013.01);
(Continued)

(58) Field of Classification Search
CPC .............................. B81C 1/0028; B81B 7/007
(Continued)

(56) References Cited

U.S. PATENT DOCUMENTS 3,728,090 A    4/1973   Hoffman et al.
5,083,466 A    1/1992   Holm-Kennedy et al.
(Continued)

FOREIGN PATENT DOCUMENTS

EP           0971208 A2    1/2000
JP           H1038578 A    2/1998
(Continued)

OTHER PUBLICATIONS

U.S. Appl. No. 14/853,873, filed Sep. 14, 2015.
(Continued)

*Primary Examiner* — David S Blum
(74) *Attorney, Agent, or Firm* — Amin, Turocy & Watson, LLP (57) ABSTRACT

A method of bonding of germanium to aluminum between two substrates to create a robust electrical and mechanical contact is disclosed. An aluminum-germanium bond has the following unique combination of attributes: (1) it can form a hermetic seal; (2) it can be used to create an electrically conductive path between two substrates; (3) it can be patterned so that this conduction path is localized; (4) the bond can be made with the aluminum that is available as standard foundry CMOS process. This has the significant advantage of allowing for wafer-level bonding or packaging without the addition of any additional process layers to the CMOS wafer.

18 Claims, 4 Drawing Sheets

Related U.S. Application Data continuation of application No. 14/157,456, filed on Jan. 16, 2014, now Pat. No. 9,139,428, which is a continuation of application No. 13/333,580, filed on Dec. 21, 2011, now Pat. No. 8,633,049, which is a continuation of application No. 12/184,231, filed on Jul. 31, 2008, now Pat. No. 8,084,332, which is a continuation of application No. 11/084,296, filed on Mar. 18, 2005, now Pat. No. 7,442,570.

(51) Int. Cl.
| | |
|---|---|
| *H01L 31/0376* | (2006.01) |
| *H01L 31/20* | (2006.01) |
| *H01L 27/14* | (2006.01) |
| *H01L 29/82* | (2006.01) |
| *H01L 29/84* | (2006.01) |
| *B81C 1/00* | (2006.01) |
| *H01L 21/18* | (2006.01) |
| *B81B 3/00* | (2006.01) |
| *B81C 3/00* | (2006.01) |
| *B23K 20/02* | (2006.01) |
| *B81B 7/00* | (2006.01) |

(52) U.S. Cl.
CPC .......... *B81B 7/007* (2013.01); *B81C 1/00269* (2013.01); *B81C 3/001* (2013.01); *H01L 21/187* (2013.01); *B81B 2203/0315* (2013.01); *B81B 2207/012* (2013.01); *B81B 2207/094* (2013.01); *B81C 2203/0118* (2013.01); *B81C 2203/035* (2013.01); *B81C 2203/038* (2013.01); *B81C 2203/0792* (2013.01)

(58) Field of Classification Search
USPC .......................................... 257/62, 414, 417
See application file for complete search history.

(56) References Cited

U.S. PATENT DOCUMENTS

| | | | |
|---|---|---|---|
| 5,249,732 A | 10/1993 | Thomas | |
| 5,359,893 A | 11/1994 | Dunn | |
| 5,367,194 A | 11/1994 | Beatty | |
| 5,426,070 A | 6/1995 | Shaw et al. | |
| 5,481,914 A | 1/1996 | Ward | |
| 5,485,032 A | 1/1996 | Schepis et al. | |
| 5,656,778 A | 8/1997 | Roszhart | |
| 5,659,195 A | 8/1997 | Kaiser et al. | |
| 5,693,574 A | 12/1997 | Schuster et al. | |
| 5,703,293 A | 12/1997 | Zabler et al. | |
| 5,780,740 A | 7/1998 | Lee et al. | |
| 5,895,850 A | 4/1999 | Buestgens | |
| 5,897,341 A | 4/1999 | Love | |
| 5,915,168 A | 6/1999 | Salatino et al. | |
| 5,992,233 A | 11/1999 | Clark | |
| 5,996,409 A | 12/1999 | Funk et al. | |
| 6,036,872 A | 3/2000 | Wood et al. | |
| 6,062,082 A | 5/2000 | Guenther et al. | |
| 6,122,961 A | 9/2000 | Geen et al. | |
| 6,128,961 A | 10/2000 | Haronian | |
| 6,153,917 A | 11/2000 | Matsunaga et al. | |
| 6,189,381 B1 | 2/2001 | Huang et al. | |
| 6,199,748 B1 | 3/2001 | Zhu et al. | |
| 6,229,190 B1 | 5/2001 | Bryzek et al. | |
| 6,250,157 B1 | 6/2001 | Touge | |
| 6,391,673 B1 | 5/2002 | Ha et al. | |
| 6,426,687 B1 | 7/2002 | Osborn | |
| 6,430,998 B2 | 8/2002 | Kawai et al. | |
| 6,433,411 B1 | 8/2002 | Degani et al. | |
| 6,448,109 B1 | 9/2002 | Karpman | |
| 6,452,238 B1 | 9/2002 | Orcutt et al. | |
| 6,479,320 B1 | 11/2002 | Gooch | |
| 6,480,320 B2 | 11/2002 | Nasiri | |
| 6,481,283 B1 | 11/2002 | Cardarelli | |
| 6,481,284 B2 | 11/2002 | Geen et al. | |
| 6,481,285 B1 | 11/2002 | Shkel et al. | |
| 6,487,908 B2 | 12/2002 | Geen et al. | |
| 6,508,122 B1 | 1/2003 | McCall et al. | |
| 6,513,380 B2 | 2/2003 | Reeds, III et al. | |
| 6,519,075 B2 | 2/2003 | Carr et al. | |
| 6,528,344 B2 | 3/2003 | Kang | |
| 6,528,887 B2 | 3/2003 | Daneman et al. | |
| 6,533,947 B2 | 3/2003 | Nasiri et al. | |
| 6,555,417 B2 | 4/2003 | Spooner et al. | |
| 6,559,530 B2 | 5/2003 | Goldsmith et al. | |
| 6,621,137 B1 | 9/2003 | Ma et al. | |
| 6,629,460 B2 | 10/2003 | Challoner | |
| 6,635,509 B1 | 10/2003 | Ouellet | |
| 6,650,455 B2 | 11/2003 | Miles | |
| 6,660,564 B2 | 12/2003 | Brady | |
| 6,686,639 B1 | 2/2004 | Tsai | |
| 6,770,569 B2 | 8/2004 | Foerstner et al. | |
| 6,794,272 B2 | 9/2004 | Turner et al. | |
| 6,796,178 B2 | 9/2004 | Jeong et al. | |
| 6,808,955 B2 | 10/2004 | Ma | |
| 6,852,926 B2 | 2/2005 | Ma et al. | |
| 6,892,575 B2 | 5/2005 | Nasiri et al. | |
| 6,918,297 B2 | 7/2005 | MacGugan | |
| 6,936,491 B2 | 8/2005 | Partridge et al. | |
| 6,936,494 B2 | 8/2005 | Cheung | |
| 6,939,473 B2 | 9/2005 | Nasiri et al. | |
| 6,943,484 B2 | 9/2005 | Clark et al. | |
| 7,004,025 B2 | 2/2006 | Tamura | |
| 7,028,547 B2 | 4/2006 | Shiratori et al. | |
| 7,104,129 B2 | 9/2006 | Nasiri et al. | |
| 7,196,404 B2 | 3/2007 | Schirmer et al. | |
| 7,247,246 B2 | 7/2007 | Nasiri et al. | |
| 7,642,692 B1 | 1/2010 | Pulskamp | |
| 7,907,838 B2 | 3/2011 | Nasiri et al. | |
| 8,220,330 B2 | 7/2012 | Miller et al. | |
| 8,236,577 B1 | 8/2012 | Hsu et al. | |
| 2002/0051258 A1 | 5/2002 | Tamura | |
| 2003/0074967 A1 | 4/2003 | Tang et al. | |
| 2003/0110858 A1 | 6/2003 | Kim et al. | |
| 2003/0164041 A1 | 9/2003 | Jeong et al. | |
| 2004/0055380 A1 | 3/2004 | Shcheglov et al. | |
| 2005/0081633 A1 | 4/2005 | Nasiri et al. | |
| 2005/0170656 A1 | 8/2005 | Nasiri et al. | |

FOREIGN PATENT DOCUMENTS

| | | |
|---|---|---|
| JP | 2002148048 A | 5/2002 |
| WO | 0029822 | 5/2000 |
| WO | 0171364 A1 | 9/2001 |
| WO | 0242716 | 5/2002 |
| WO | 03038449 | 5/2003 |

OTHER PUBLICATIONS

U.S. Appl. No. 14/157,456, filed Jan. 16, 2014.
U.S. Appl. No. 13/333,580, filed Dec. 21, 2011.
U.S. Appl. No. 12/184,231, filed Jul. 31, 2008.
U.S. Appl. No. 11/084,296, filed Mar. 18, 2005.
Vu et al., Patterned eutectic bonding with Al/Ge thin films for microelectromechanical systems, May 31, 1996, 2588-2594.
Sood, et al., "Al—Ge Eutectic Wafer Bonding and Bond Characterization for CMOS Compatible Wafer Packaging", SVTC Technologies, May 8, 2010, pp. 1-8.
Supplementary European Search Report dated Jul. 20, 2010, application No. 06737697.0-1528/ 1859475, PCT/US2006008543.
WIPO Publication WO 02/42716 A2 (Microsensors Inc.), published May 30, 2002.
WIPO Publication WO 03/038449 A1 (Austriamicrosystems AG), published May 8, 2003.
Amendment filed Feb. 14, 2011, in European Patent Application No. 06737697.0-1528.
Notification of Transmittal of the International Search Report and the Written Opinion of the International Searching Authority or the Declaration, issued in International Application No. PCT/US06/44919, Feb. 7, 2008.

(56) References Cited

OTHER PUBLICATIONS

Non-Final Office Action dated Feb. 4, 2016, U.S. Appl. No. 14/853,873, 12 pages.
Final Office Action dated May 25, 2016, U.S. Appl. No. 14/853,873, 11 pages.
CN Office Action dated Jul. 14, 2016, Application No. 201510523999.2, 6 pages.
Non-Final Office Action dated Aug. 10, 2004, U.S. Appl. No. 10/690,224, 12 pages.
Non-Final Office Action dated Dec. 21, 2004, U.S. Appl. No. 10/691,472, 10 pages.
Non-Final Office Action dated Oct. 3, 2005, U.S. Appl. No. 10/770,838, 13 pages.
Final Office Action dated Mar. 22, 2006, U.S. Appl. No. 10/770,838, 9 pages.
Non-Final Office Action dated Mar. 22, 2006, U.S. Appl. No. 10/771,135, 11 pages.
Final Office Action dated Sep. 20, 2006, U.S. Appl. No. 10/771,135, 7 pages.
Chinese Office Action dated Mar. 6, 2017 for Chinese Application No. 201510523999.2, 5 pages (with translation).

METHOD OF FABRICATION OF AL/GE BONDING IN A WAFER PACKAGING ENVIRONMENT AND A PRODUCT PRODUCED THEREFROM

PRIORITY CLAIM

Under 35 U.S.C. 120, this application is a Continuation Application and claims priority to U.S. application Ser. No. 14/853,873, filed Sep. 14, 2015, now U.S. Pat. No. 9,533,880, which is a Continuation Application to U.S. application Ser. No. 14/157,456, filed Jan. 16, 2014, now U.S. Pat. No. 9,139,428, which is a Continuation Application to U.S. Pat. No. 8,633,049, issued Jan. 21, 2014, which is a continuation of U.S. Pat. No. 8,084,332, issued Dec. 27, 2011, which is a continuation of U.S. Pat. No. 7,442,570, issued Oct. 28, 2008, which is related to U.S. Pat. No. 6,892,575, and related to U.S. Pat. No. 6,939,473, and related to U.S. Pat. No. 7,104,129 and related to U.S. Pat. No. 7,247,246, all of which are incorporated herein by reference.

TECHNICAL FIELD

The present invention relates generally to wafer bonding and more particularly to a method and system of bonding in a wafer packaging environment.

BACKGROUND

MEMS technology has been under steady development for some time, and as a result various MEMS devices have been considered and demonstrated for several applications. MEMS technology is an attractive approach for providing inertial sensors, such as accelerometers for measuring linear acceleration and gyroscopes for measuring angular velocity. A MEMS inertial sensor typically includes a proof mass which is flexibly attached to the rest of the device. Relative motion between the proof mass and the rest of the device is driven by actuators and/or sensed by sensors in various ways, depending on the detailed device design. Other MEMS applications include optical applications such as movable mirrors, and RF applications such as RF switches and resonators.

Since MEMS fabrication technology is typically based on processing planar silicon wafers, it is useful to classify MEMS devices according to whether the actuation and/or sensing performed in an inertial sensor (or other application) is in-plane or out of plane (i.e., vertical). More specifically, a device is "in-plane" if all of its sensing and/or actuation is in-plane, otherwise it is "vertical". Thus MEMS devices are undergoing steady development, despite fabrication difficulties that tend to increase.

One approach which has been used to fabricate vertical MEMS devices is hybrid integration, where elements of a MEMS assembly are individually assembled to form the desired vertical structure. For example, attachment of a spacer to a substrate, followed by attachment of a deformable diaphragm to the spacer, provides a vertical MEMS structure having a spacing between diaphragm and substrate controlled by the spacer. U.S. Pat. No. 6,426,687 provides further information on this approach. Although hybrid integration can provide vertical MEMS devices, the cost tends to be high, since manual processing steps are usually required, and because hybrid integration is typically performed on single devices. Therefore, there is a need for reduced cost integrated MEMS devices that is unmet in the prior art.

CMOS compatible wafer-wafer bonding is very desirable for wafer-level-packaging. Its use has been demonstrated in a variety of different technologies. However, most of these processes have been limited to providing protection of a sensitive feature from post process handling, such as sawing, die bonding, testing, package, etc.

The need for a robust wafer level integration that can allow for simultaneous wafer-level-packaging and electrical interconnect is very high and can open up a multitude of new smaller, low-cost and feature rich MEMS products. The following describes conventional methods for bonding and their problems. Organic or Adhesive Based Methods Materials such as Benzocyclobutene (BCB), polyamide, photo resists, patternable RTV, and others have been spun on and used to form permanent bonds between wafers. These materials have disadvantages in that because they are organic, they tend to outgas and so are unsuitable for forming hermetic enclosures, and also they are susceptible to solvents, or moistures which can lead to problems with long term reliability and drift of a device's performance. Additionally, they are insulating materials and so are incapable of forming a conductive path between two substrates.

One popular method of making wafer-wafer bonding is by use of frit glass. Frit glass is typically screen printed on the cover wafers and reflowed to form a patterned glass interface for subsequent wafer-wafer bonding. Frit glass has a typical melting point near 500° C. and can be remelted post wafer-wafer aligned bond in a special temperature chamber with a controlled environment. The primary use of glass frit is to provide for the cover substrate and a hermetic sealed cavity for the MEMS. Frit glass technology has been utilized in the MEMS industry for many decades. Several major drawbacks are that frit glass does not provide for electrical interconnection between the MEMS and cover, to achieve a hermetic seal interface, minimum of 400 micron seal ring width is required which makes small MEMS devices, such as resonators and optical devices, much larger than otherwise. Also, frit glass screen printed is inherently a thick film process with tens of microns in thickness and several microns of nonuniformity.

Metal-Metal Bonding

CMOS compatible eutectic bonding has been demonstrated with indium-gold, solder-gold, gold-gold, etc. In order to bond a CMOS wafer, all of these prior art systems require the addition of non-standard layers, such as plating of lead, indium, gold, etc., to be added to the CMOS wafer. Although these processes are capable of hermetic seals and electrical interface, achieving fine features, small gaps and wafer uniformity is very challenging and will result in yield losses.

There are many MEMS device applications that require an electro-mechanical interface between the CMOS substrate and the MEMS substrates that are in micron gaps and require submicron uniformity. Most plating processes require under-layer barrier metalization with tens of microns thickness, and uniformity across the wafer is measured in microns. Hence it is not possible to specify one or two micron gap controls between the MEMS and CMOS substrates using this bonding methodology.

The ability to make high density and reliable electrical contacts between the MEMS and CMOS substrates can be very beneficial and provide for an all new generation of MEMS devices with much added functionality, smart electronics, smaller size, and lower cost. Finally, it is important to provide a lead free alloy based upon environmental considerations.

Accordingly, what is needed is a system and method for providing wafer bonding that overcomes the above-identified problems. The system and method should be easily implemented, cost effective and adaptable to existing bonding processes. The present invention addresses such a need.

SUMMARY

A method of bonding two substrates to create a robust electrical and mechanical contact by using aluminum and germanium eutectic alloys is disclosed. An aluminum-germanium bond has the following unique combination of attributes: (1) it can form a hermetic seal; (2) it can be used to create an electrically conductive path between two substrates; (3) it can be patterned so that this conduction path is localized; (4) the bond can be made with the aluminum that is available as a standard foundry CMOS process; (5) this process is compatible with completely fabricated CMOS wafers as post process; (6) this process can provide for high density electrical interconnect; and (7) this process is highly controllable and provides for the smallest gap between two substrates. This has the significant advantage of allowing for wafer-level bonding or packaging without the addition of any additional process layers to the CMOS wafer.

DETAILED DESCRIPTION

The present invention relates generally to wafer bonding and more particularly to a method and system of bonding utilizing aluminum and germanium in a wafer-level packaging of MEMS devices with electrical substrate interconnect environment. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
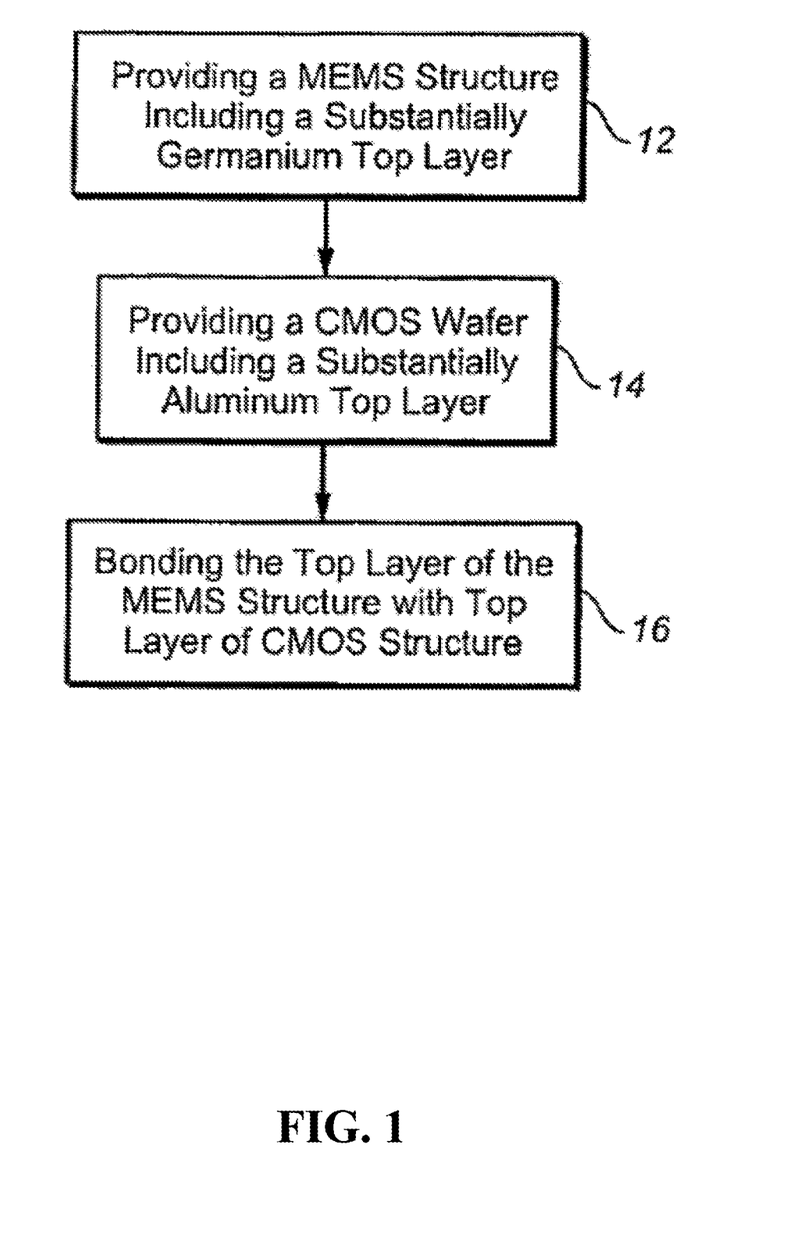
FIG. 1 is a flow chart of a method for fabrication of a wafer level package in accordance with the present invention.

FIG. 1 is a flow chart of a method of fabrication of a wafer level package in accordance with the present invention. The method comprises providing a MEMS structure including a substantially germanium top layer, via step 12, and providing a CMOS structure including a substantially aluminum top layer, via step 14. Finally, the method comprises bonding the top layer of the MEMS structure with the top layer of the CMOS structure, via step 16.

Figure 2A:
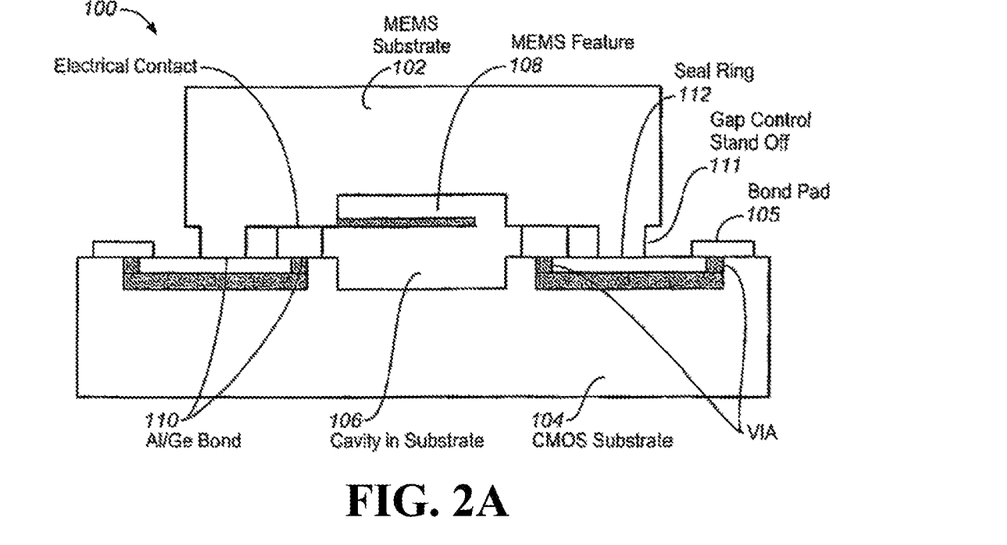
FIGS. 2A and 2B are cross sectional and top views of a first embodiment of an assembly in accordance with the present invention.
Figure 2B:
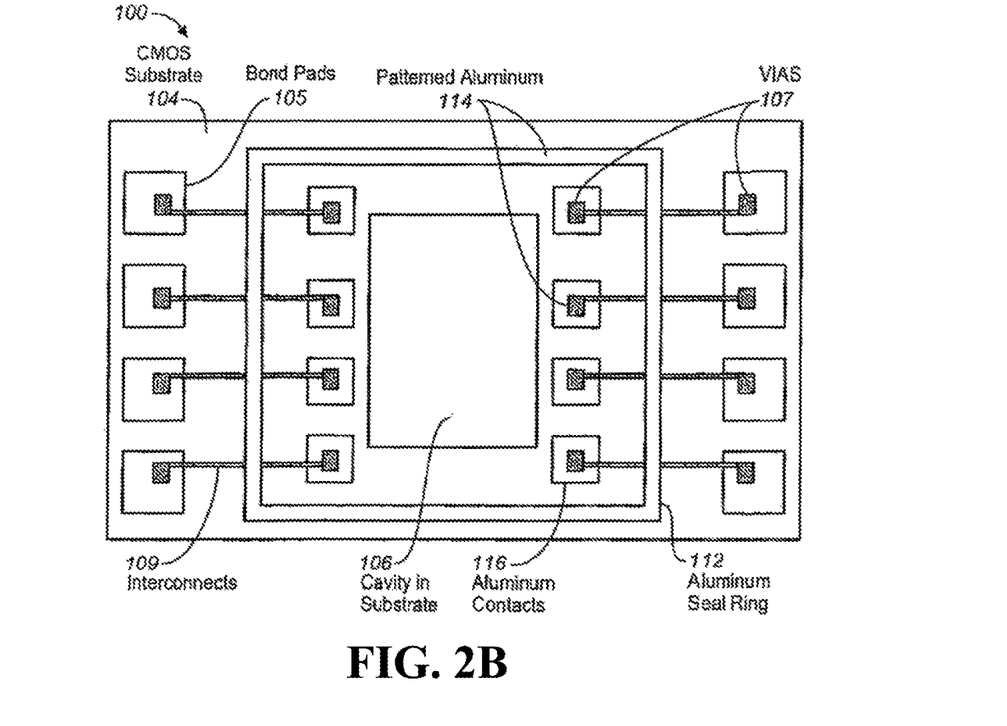

The following describes a preferred embodiment in accordance with the present invention. FIGS. 2A and 2B are cross sectional and top views of a first embodiment of an assembly 100 in accordance with the present invention. Referring to the embodiment shown in FIG. 2A, a standard foundry CMOS wafer 104 which includes aluminum is bonded to a MEMS substrate 102 which includes germanium to provide an aluminum/germanium (Al/Ge) bond 110. In this embodiment, a cavity 106 is within the substrate 104. The CMOS substrate wafer 104 can be any substrate with patterned aluminum shown in FIG. 2B that is designed to interface with the MEMS substrate 102 to make for a complete functioning product. In addition, a plurality of aluminum contacts 116 are on the top of the CMOS substrate 104 which are coupled to bond pads 105 by interconnect 107. Vias 107 are provided in both the bond pads 105 and the aluminum contacts 116 to allow for electrical connection thereto. As an example, the substrate 104 can comprise only a collection of metal layers and interconnects for providing for an electrical interconnection to the MEMS layers. Furthermore, the MEMS substrate 102 includes a MEMS feature 108 to complement the MEMS layers on the MEMS substrates 104, such as corresponding cavity 106. A gap control standoff 111 is provided to provide a precise separation of the MEMS substrate 102 from the CMOS substrate 104. The gap control standoff 111 provides a seal ring 112 for the device.

Figure 3A:
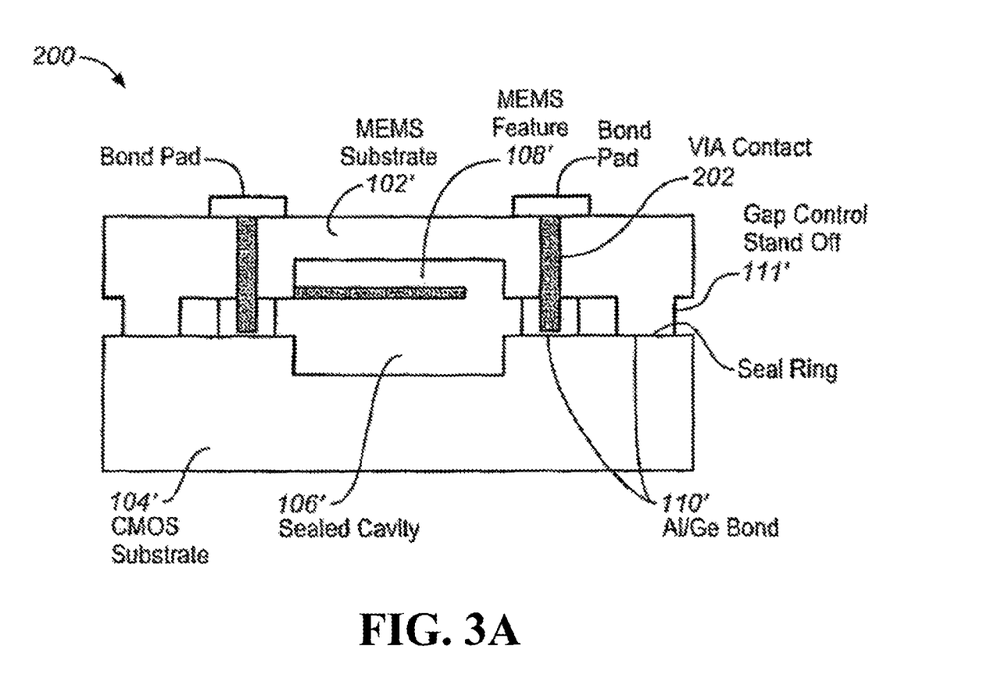
FIGS. 3A and 3B are cross sectional and top views of a second embodiment of an assembly in accordance with the present invention.
Figure 3B:
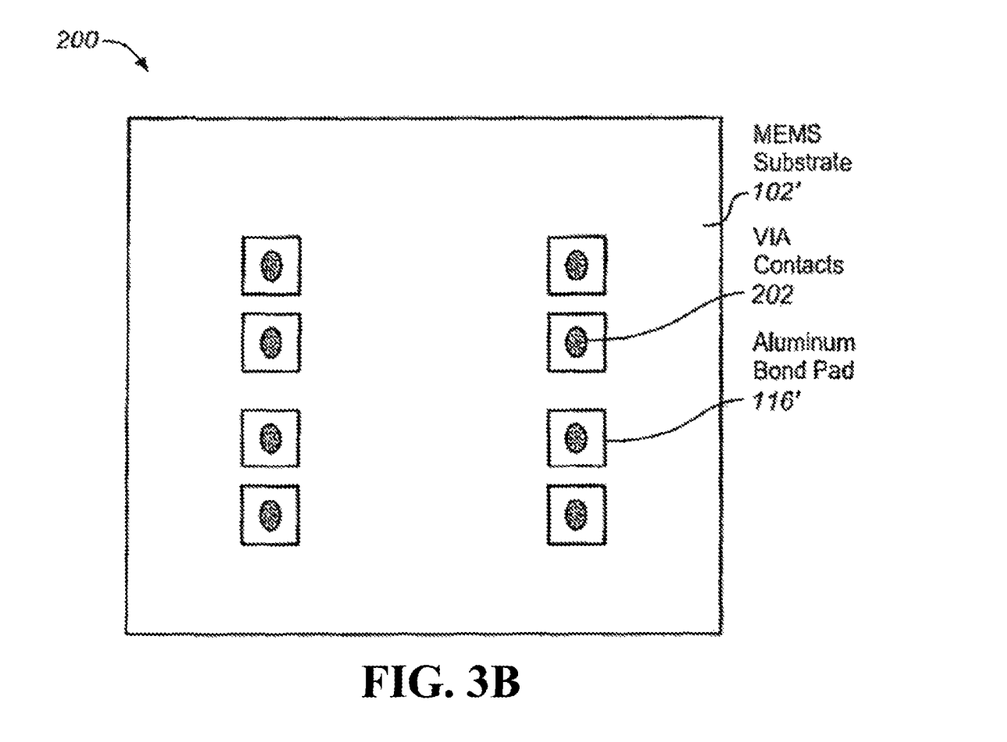

FIGS. 3A and 3D are cross sectional and top views of a second embodiment of an assembly in accordance with the present invention. The assembly 200 includes many of the same elements as assembly 100 of FIGS. 2A and 2B and those elements have the same reference numerals. Additionally, the assembly 200 has via contacts 202 through the MEMS substrate 102' and the gap control standoff 111 to provide electric feedthrough of signals.

Another important feature of the substrate 104 is the availability of the multilayer metallization standard in CMOS foundries with chemical-mechanical-polishing of the oxide to make for a very planar metallized layer suitable for forming Al/Ge eutectic alloy with a germanium presence on the MEMS layer. The MEMS substrate 102 can be a silicon wafer or combination of silicon wafers assembled with all the MEMS features and functionalities including any type of preprocessed features.

In the preferred embodiment, the MEMS substrate on which the germanium has been patterned is a silicon substrate doped with boron to a conductivity of 0.006-0.020 cm. This p+ doping forms an ohmic contact with the aluminum-germanium eutectic mix following the bond.

To describe the bonding layers in more detail refer now to the following.

Bonding Layers

In a preferred embodiment, the top metal layer of the foundry CMOS wafer is a ratio mix of 97.5:2:0.5 Al:Si:Cu and is 700 nm thick and is on a planarized oxide layer using CMP which is the standard processing step for most CMOS processes of 0.5 um or lower geometries. In a preferred embodiment, the bonding layers on the MEMS are 500 nm of germanium deposited in a standard vacuum sputter deposition system which is properly patterned to match the corresponding aluminum patterned for bonding.

Below is an example of the preferred embodiment of the equipment and process in accordance with the present invention.

Required Equipment

The bonding is performed in a commercially available wafer bonder such as that supplied by Electronic Visions Group, Inc., or Suss Microtec, Inc. The equipment should meet the following standards and have the following capabilities: (1) temperature control of both the top and the bottom chuck to nominally 450 degrees Celsius (C); (2)

ambient pressure control to sub-tor; (3) ambient gas control (via a purge line); (4) plumbed with 4-3-5 percent forming gas; and (5) the capability of applying a uniform force across the wafer pair of a minimum of 3000N.

In the preferred embodiment, the wafers are pre cleaned and then aligned prior to bonding in a compatible alignment tool.

Pre-Bond Cleaning

In the preferred embodiment, both the CMOS wafer and the MEMS wafer are cleaned prior to bonding. Both wafers are assumed to be free of any photoresist or other extraneous materials from previous processing steps. The wafers are cleaned by: (1) a 1.30 second dip in deionized water, (2) a 1.30 second dip in 50:1 HF; (3) a dump rinse; and (4) a standard spin-rinse-dry process.

Alignment

The bonding pair is aligned in an Electronic Visions 620 wafer-wafer aligner. Separation flags are inserted to maintain separation of the bonded pair prior to bonding.

Bonding

Figure 4:
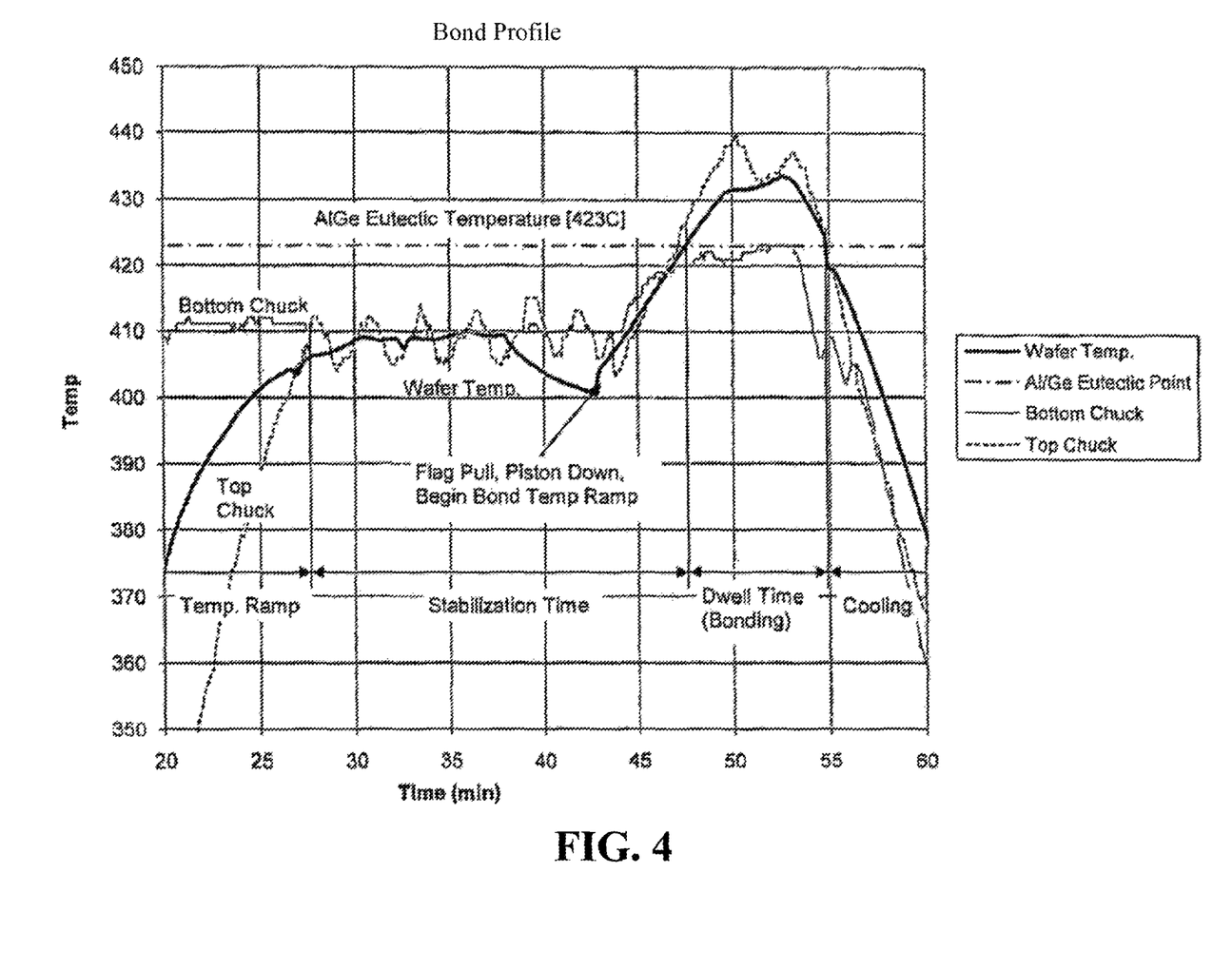
FIG. 4 illustrates an exemplary bonding profile to achieve a proper Al/Ge bond.

The aligned pair is transferred to an Electronic Visions 501 bonder. The purge line of this machine has been plumbed with forming gas. Following the cool down period of the bonding recipe, the bonding is complete and requires no further processing. An example of an exemplary bonding temperature profile for achieving the proper Al/Ge bond is shown in FIG. 4.

Description of Various and Alternate Embodiments

Alternative embodiments include, for example, (1) the utilization of different materials on top of the germanium to protect it during subsequent MEMS processing; (2) the employment of different pre-bond cleaning methods; (3) the bond may be performed unaligned; (4) the bond may be performed without patterning the aluminum and/or the germanium; (5) the CMOS wafer may be bonded without any additional processing other than the pre-bond clean; (6) the aluminum-germanium bond may be configured so as not to create a hermetic seal; (7) utilization of a substrate other than a MEMS wafer (such as a simple cover wafer); (8) the MEMS substrate may comprise something other than a gyroscope (such as a pressure sensor or accelerometer); (9) the aluminum of the standard CMOS wafer may comprise different formulations of standard aluminum (2% silicon, 2% silicon/1% copper, etc.)

In addition, (10) a specific temperature profile can be utilized; (11) a forming gas can be used to deoxidize the contact surfaces; (12) aluminum can be utilized as the standard metallization used for IC fabrication; (13) aluminum substrate can be kept below a predetermined temperature to prevent complete leaching of aluminum and germanium alloy from the oxide on the substrate; (14) the bonding can be performed using controlled ambient such as forming gas; (15) the bonding can be performed using low pressure bonding force or high pressure bonding force as assistance for/in order to assist in breaking of the aluminum oxide to initiate the interaction; (16) two wafers can be prealigned prior to bonding process; (17) a special cleaning solution can be utilized to clean the oxide from both surfaces; (18) the bonding surfaces can be cleaned by sputter etching; (19) a thin layer of TiW can be utilized to protect the bonding surface during MEMS processing; (20) including pre bond cleaning using plasma and/or other insitu cleaning techniques, in addition to a more concentrated forming gas and higher force bond; (21) the germanium can be deposited on a non-conductive layer (such as silicon dioxide) to create an insulating contact.

The germanium can be deposited on a semiconductor substrate that has been doped such that the resulting contact between the aluminum of the substrate and the MEMS is rectifying. This substrate can be a silicon substrate with n-type doping to 0.020.05 Q-cm.

The germanium can be deposited on a semiconductor substrate that has been doped such that the resulting contact between the aluminum of the substrate and the MEMS is ohmic.

A method and structure of bonding of germanium to aluminum between two substrates to create a robust electrical and mechanical contact is disclosed. An aluminum-germanium bond has the following unique combination of attributes: (1) it can form a hermetic seal; (2) it can be used to create an electrically conductive path between two substrates; (3) it can be patterned so that this conduction path is localized; (4) the bond can be made with the aluminum that is available as a standard foundry CMOS process. This has the significant advantage of allowing for wafer-level bonding or packaging without the addition of any additional process layers to the CMOS wafer.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A microelectromechanical systems (MEMS) device comprising:
   a first substrate comprising a MEMS feature and a patterned germanium layer in direct contact with the first substrate; and
   a second substrate comprising a patterned aluminum layer, wherein germanium of the patterned germanium layer of the first substrate is in direct contact with and matched to aluminum of the patterned aluminum layer of the second substrate to form a hermetic seal ring, wherein the patterned aluminum layer is properly patterned to match the patterned germanium layer in the area of the hermetic seal ring.

2. The MEMS device of claim 1, wherein the second substrate further comprises an electrical contact associated with the patterned aluminum layer, coupled with an integrated circuit within the second substrate, and located within an outer perimeter of the hermetic seal ring.

3. The MEMS device of claim 2, wherein the first substrate and the second substrate are electrically connected via an inter-substrate electrical contact comprising the electrical contact and the patterned germanium layer of the first substrate.

4. The MEMS device of claim 3, wherein the integrated circuit has a multilayer metalization electrically coupled with at least a portion of the patterned aluminum layer and configured to allow electrical under pass feedthrough via the inter-substrate electrical contact from the integrated circuit to the MEMS feature.

5. The MEMS device of claim 3, wherein the first substrate further comprises at least one via configured to provide electric feedthrough of signals to the one electrical contact of the second substrate.

6. The MEMS device of claim 1, wherein at least one of the first substrate or the second substrate comprises at least one of a silicon substrate, a multiple layer of silicon substrates, or a substrate comprising at least one of gallium arsenide (GaAs), indium phosphide (InPh), silicon germanium (SiGe), or glass.

7. A wafer structure comprising:
a first substrate comprising at least one microelectromechanical systems (MEMS) feature, wherein the first substrate further comprises at least one patterned germanium layer; and
a second substrate comprising at least one patterned aluminum layer and one electrical contact, wherein the at least one patterned germanium layer is bonded to the at least one patterned aluminum layer to create an inter-substrate electrical contact and a mechanical contact between the first substrate and the second substrate.

8. The wafer structure of claim 7, wherein at least one of the first substrate or the second substrate comprises at least one of a silicon substrate, a multiple layer of silicon substrates, or a substrate comprising at least one of gallium arsenide (GaAs), indium phosphide (InPh), silicon germanium (SiGe), or glass.

9. The wafer structure of claim 7, wherein the first substrate comprises MEMS structures and a cavity.

10. The wafer structure of claim 7, wherein the second substrate comprises an integrated circuit.

11. The wafer structure of claim 10, wherein the integrated circuit has a multilayer metalization electrically coupled with at least a portion of the at least one patterned aluminum layer and configured to allow electrical under pass feedthrough via the inter-substrate electrical contact to the integrated circuit.

12. The wafer structure of claim 11, wherein a plurality of contact pads are located outside an outer perimeter of a hermetic sealing ring that provides a hermetic seal associated with the mechanical contact and wherein at least one of the plurality of contact pads is electrically coupled to the one electrical contact of the second substrate located within the outer perimeter of the hermetic sealing ring.

13. The wafer structure of claim 12, wherein the at least one patterned germanium layer and the at least one patterned aluminum layer are bonded to provide the hermetic seal.

14. The wafer structure of claim 10, wherein the first substrate further comprises at least one via configured to provide electric feedthrough of signals to the one electrical contact of the second substrate.

15. The wafer structure of claim 7, wherein the at least one patterned germanium layer is bonded to the at least one patterned aluminum layer via an eutectic composition of aluminum and germanium.

16. A wafer structure comprising:
a first substrate comprising at least one microelectromechanical systems (MEMS) feature, wherein the first substrate further comprises at least one patterned germanium layer and at least one via configured to provide electric feedthrough of signals; and
a second substrate comprising at least one patterned aluminum layer and one electrical contact, wherein the at least one patterned germanium layer is bonded to the at least one patterned aluminum to mechanically couple the first substrate to the second substrate via a hermetic seal ring and to electrically couple the at least one via of the first substrate to the one electrical contact of the second substrate within the hermetic seal ring.

17. The wafer structure of claim 16, wherein at least one of the first substrate or the second substrate comprises at least one of a silicon substrate, a multiple layer of silicon substrates, or a substrate comprising at least one of gallium arsenide (GaAs), indium phosphide (InPh), silicon germanium (SiGe), or glass.

18. The wafer structure of claim 16, wherein the second substrate comprises an integrated circuit having a multilayer metalization electrically coupled with at least a portion of the at least one patterned aluminum layer and configured to provide the one electrical contact to facilitate the electric feedthrough of signals between the first substrate and the second substrate.

* * * * *